(12) United States Patent
Overweg

(10) Patent No.: US 9,274,192 B2
(45) Date of Patent: Mar. 1, 2016

(54) MAGNETIC RESONANCE IMAGING GRADIENT COIL, MAGNET ASSEMBLY, AND SYSTEM

(75) Inventor: Johannes Adrianus Overweg, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 614 days.

(21) Appl. No.: 13/696,127

(22) PCT Filed: May 13, 2011

(86) PCT No.: PCT/IB2011/052102
§ 371 (c)(1),
(2), (4) Date: Nov. 5, 2012

(87) PCT Pub. No.: WO2011/145029
PCT Pub. Date: Nov. 24, 2011

(65) Prior Publication Data
US 2013/0106420 A1    May 2, 2013

(30) Foreign Application Priority Data

May 20, 2010    (EP) .................................... 10163363

(51) Int. Cl.
*G01V 3/00* (2006.01)
*G01R 33/385* (2006.01)
*G01R 33/421* (2006.01)

(52) U.S. Cl.
CPC .......... *G01R 33/385* (2013.01); *G01R 33/3854* (2013.01); *G01R 33/4215* (2013.01)

(58) Field of Classification Search
CPC ..................................................... G01R 33/385
USPC ....................................................... 324/322
See application file for complete search history.

(56) References Cited

U.S. PATENT DOCUMENTS 4,878,024 A * 10/1989 Overweg et al. .............. 324/319
5,331,281 A    7/1994 Otsuka
(Continued)

FOREIGN PATENT DOCUMENTS

JP    59216045 A    6/1984
WO    9631785 A1    10/1996
(Continued)

OTHER PUBLICATIONS

Peeren, G. N.; Stream Function Approach for Determining Optimal Surface Currents; 2003; J. Comput Phys.; 191:305-321.
(Continued)

*Primary Examiner* — Rodney Fuller

(57) ABSTRACT

A magnetic resonance imaging magnet assembly (100) comprising: —a magnet (102) adapted for generating a main magnetic field for aligning the magnetic spins of nuclei of a subject (502) located within an imaging volume (504); and —a gradient coil (103) for generating a gradient magnetic field for spatial encoding of the magnetic resonance signal of spins of nuclei within the imaging volume, wherein the gradient coil is adapted to be mounted into the magnet, wherein the gradient coil comprises: —a first gradient coil section (112), wherein the first gradient coil section comprises a first rigid element (113), —a second gradient coil section (114), wherein the second gradient coil section also comprises a second rigid element (115), —a connecting element (116, 300, 302, 304, 400) for joining the two half gradient coils, wherein the connecting element comprises an elastic material (116), wherein the elastic material is in contact with the first rigid element and the second rigid element.

20 Claims, 5 Drawing Sheets

(56) References Cited

U.S. PATENT DOCUMENTS

| | | | |
|---|---|---|---|
| 5,764,059 | A | 6/1998 | Mansfield et al. |
| 6,437,568 | B1 * | 8/2002 | Edelstein et al. ............. 324/318 |
| 6,462,547 | B1 * | 10/2002 | Heid et al. .................... 324/318 |
| 6,954,068 | B1 * | 10/2005 | Takamori et al. ............. 324/318 |
| 8,890,529 | B2 * | 11/2014 | Jiang et al. ................... 324/318 |
| 2004/0113618 | A1 | 6/2004 | Schuster |
| 2004/0113619 | A1 | 6/2004 | Schuster et al. |
| 2004/0239327 | A1 | 12/2004 | Heid et al. |
| 2008/0272784 | A1 | 11/2008 | Harvey et al. |
| 2009/0209842 | A1 | 8/2009 | Koevoets et al. |
| 2010/0027264 | A1 | 2/2010 | MacDougall et al. |

FOREIGN PATENT DOCUMENTS

| | | |
|---|---|---|
| WO | 9735214 A1 | 9/1997 |
| WO | 0116616 A2 | 3/2001 |
| WO | 2008122899 A1 | 10/2008 |
| WO | 2009074918 A1 | 6/2009 |

OTHER PUBLICATIONS

Poole, M., et al.; Novel Gradient Coils Designed Using a Boundary Element Method; 2007; Concepts in Magnetic Resonance Part B: Magnetic Resonance Engineering; 31B(3)162-175.

* cited by examiner

MAGNETIC RESONANCE IMAGING GRADIENT COIL, MAGNET ASSEMBLY, AND SYSTEM

TECHNICAL FIELD

The invention relates to magnetic resonance imaging systems, in particular to the design of gradient coils for such systems.

BACKGROUND OF THE INVENTION

A static magnetic field is used by Magnetic Resonance Imaging (MRI) system to align the nuclear spins of atoms as part of the procedure for producing images within a subject. This static magnetic field is referred to as the $B_0$ field or the main field.

Magnetic field gradient coils are used to generate spatially and temporally varying magnetic fields which are used to spatially encode the nuclear spins being imaged. This spatial encoding is part of what allows the reconstruction of images from magnetic resonance imaging signals.

However Magnetic Resoance Imaging is typically performed in a large magnetic field. As current flows through a magnetic field gradient coil the Lorentz force on the coil may be enormous. Gradient coils are typically mounted on or embedded within a rigid carrier to which these forces are transferred. During operation the large forces exerted by the Lorentz for can cause acoustic vibrations in the gradient coil and the rigid carrier. These acoustic vibrations may sound like a large knocking, thumping, or clicking sound during the use of the magnetic resonance imaging system.

It is commonly known that increasing the strength of the $B_0$ field used for performing a magnetic resoance imaging scan offers the opportunity of increasing the spatial resolution and contrast resolution of the diagnostics images. This increase in resolution and contrast benefits physicians using a magnetic resoance image to diagnose a patient. However as the strength of the $B_0$ field increases, so do the Lorentz forces acting on the gradient coil during use. As the $B_0$ field increases so does the noise generated by the gradient coils during operation.

In the journal article Michael Poole, Richard Bowtell, Concepts in Magnetic Resonance Part B, Vol. 31B(3), page 162-175, 2007 a method of designing gradient coils using the boundary element is disclosed. The minimization of a functional during the design process which imposes torque-balancing of the gradient coil is disclosed.

In U.S. Pat. No. 5,764,059, an acoustically screened magnetic coil which is adapted to be placed in a static magnetic field is disclosed. Essentially a combination of active and magnetic screening for gradient coils is disclosed. A closed loop of the gradient coil carrying current is arranged such that the two different parts of the loop are mechanically coupled, dimensioned and arranged such that the Lorentz forces experienced by the magnetic equipment are substantially reduced and preferably cancelled. the US patent application US2004/0113618 shows a gradient coil system having two structurally independent sub-coils. These sub-coils are attached separately from one another so that an (RF) antenna system can be arranged between them.

SUMMARY OF THE INVENTION

The invention provides for a magnetic resonance imaging magnet assembly, a magnetic resonance imaging system, and a gradient coil in the independent claims. Embodiments are given in the dependent claims.

Magnetic resonance gradient coils exhibit mechanical resonance modes. This leads to increased acoustic noise at particular operating frequencies. Typically, gradient coils do not exhibit much mechanical damping, leading to enhanced vibration amplitudes at resonances. There is therefore a need to dampen such resonances. Attempts to dampen resonances have been largely unsuccessful, because the entire structure is optimized to withstand large Lorentz forces without mechanical failure. For example in U.S. Pat. No. 5,764,059 column 10 lines 20 through 21 it is written: "Thus contrary to intuition, a light coupling structure of high strength is required." The design taught in U.S. Pat. No. 5,764,059 teaches a method of balancing forces between coils, but does not address the problems associated with acoustic resonances in the mechanical structure.

The use of the light coupling structure in U.S. Pat. No. 5,764,059 teaches away from the solution used by embodiments of the invention to dampen resonances: According to some embodiments of the invention a mechanical damping structure may be introduced into region of the coil where no large forces are transmitted, and where significant relative motion occurs for damping material to be effective. It is preferable if damping layers are not bridged by conductors, since their mechanical stiffness would cancel the effect of the damping material. For a cylindrical gradient coil, the natural location for a damping layer is the z=0 mid-plane of the coil, but conventional gradient coils experience large bending forces acting on the mid-plane. The z direction is defined as being aligned with the axis of symmetry of a cylindrical magnet.

In some embodiments, the acoustic noise emission of the gradient coils can be reduced by incorporating a mechanical damping material or elastic material, which reduces the mechanical quality factor of the structure. In some embodiments, a cylindrical gradient coil is split mechanically in the z=0 mid-plane and the two halves are joined using an elastic or lossy material. A prerequisite for such a mechanical split is that each of the halves of the gradient coils does not experience net magnetic translational or rotational forces in the field of the main field magnet. This requirement can be met by suitable magnetic design of the coil systems.

A gradient coils built according to the invention may have the following features:
1. On splitting the coil about the z=0 plane, each half coil shall be force and torque-balanced when operated in the field of the magnet to which the coil is matched
2. The two halves of the coil are joined using mechanically lossy or elastic material such as to dampen the mechanical resonance modes of the coil. This lossy or elastic material may be incorporated in the form of a relatively thin layer of rubber.

Balancing net translational forces on gradient coils can be achieved by incorporating appropriate design constraints in the gradient design software. In a similar way, the net rotational forces can be constrained, if the coil is modeled as two independent halves. Solutions exhibiting zero torque can be found if the length of the coil is typically equal to or greater than the length of the superconducting main field magnet. The range of solutions increases if conductors are allowed to be placed on the end and mid-plane flanges of the gradient coil. Zero torque solutions can even be found for coils having an asymmetric cross-section. The damping layer at the joint between the two coils can be a layer of rubber-like material. Pre-stressing or compressing may enhance the effect of a damping layer. Alternatively, the two halves of the coil can be joined by a thin-walled short cylinder, placed either on the outside or on the inside of the coil structure, using a lossy or material for the lap joint between the coil and the joining cylinder.

A processor is an electronic component which is able to execute a program or machine executable instruction. References to the computing device comprising "a processor" should be interpreted as possibly containing more than one processor. The term computing device should also be interpreted to possibly refer to a collection or network of computing devices each comprising a processor. Many programs have their instructions performed by multiple processors that may be within the same computing device or which may even distributed across multiple computing device.

A computer-readable storage medium as used herein is any storage medium which may store instructions which are executable by a processor of a computer or computing device. The computer-readable storage medium may be a computer-readable non-transitory storage medium. The computer-readable storage medium may also be a tangible computer readable medium. In some embodiments, a computer-readable storage medium may also be able to store data which is able to be accessed by the processor of the computing device. An example of a computer-readable storage medium include, but are not limited to: a floppy disk, a magnetic hard disk drive, a solid state hard disk, flash memory, a USB thumb drive, Random Access Memory (RAM) memory, Read Only Memory (ROM) memory, an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network.

Computer memory is an example of a computer-readable storage medium. Computer memory is any memory which is directly accessible to a processor. Examples of computer memory include, but are not limited to: RAM memory, registers, and register files.

Computer storage is an example of a computer-readable storage medium. Computer storage is any non-volatile computer-readable storage medium. Examples of computer storage include, but are not limited to: a hard disk drive, a USB thumb drive, a floppy drive, a smart card, a DVD, a CD-ROM, and a solid state hard drive. In some embodiments computer storage may also be computer memory or vice versa.

In one aspect the invention provides for a magnetic resonance imaging magnet. The magnet is adapted for generating a main magnetic field for aligning the magnetic spins of nuclei of a subject located within an imaging volume. The magnet may be a superconducting magnet, a permanent magnet, or a resistive electromagnet, or a combination of any of the three. The magnet assembly further comprises a gradient coil for generating a magnetic field for a spatial encoding of the magnetic resonance signal of the spins of nuclei within the imaging volume. The gradient coil is adapted to be mounted into the magnet. The gradient coil comprises a first gradient coil section. The gradient coil further comprises a second gradient coil section. The first gradient coil section comprises a first rigid element and the second gradient coil section comprises a second rigid element. For a cylindrically shaped gradient coil, the first and second rigid elements may be rigid tubes.

The gradient coil further comprises a connecting element for joining the two half gradient coils. The connecting element comprises an elastic material. The elastic material is in contact with both the first and second elements. An example of an elastic material is rubber. The gradient coil may comprise three separate sets of coils. Each set of coils generates a gradient magnetic field in one of three spatial directions. They may be orthogonal and they may coincide with the geometric axes of x, y and z.

Each of the first and second gradient coil sections may contain coil windings of each of the at least three gradient coil systems. This embodiment may be advantageous because dividing the coil into two sections changes the resonant properties of the gradient coil. This may lead to a reduction in acoustic noise during operation of the magnetic resonance imaging magnet assembly. For example during use a series of loud thumping or clicking sounds is heard when data is acquired with the magnetic resonance imaging system. Embodiments of the invention may reduce this acoustic noise and make it more comfortable for a patient to be examined in a magnetic resonance imaging system.

In another embodiment both the first and second gradient coil sections comprise coil windings. The first and second gradient coil sections comprise inner and outer windings. The inner windings provide the magnetic field for creating the gradient magnetic fields during operation. The outer windings may be shield windings which cancel the magnetic field from the gradient coil from inducing eddy currents in other parts of the magnetic resonance imaging magnet assembly. Such a gradient coil is known in the art as an active shielded gradient coil. The coil windings comprise flange conductors. The flange conductors are portions of the coil windings that go between the inner and outer windings. The flange conductors are designed such that the flange conductors are adapted to balance a torque exerted on the gradient coil by the main magnetic field during operation of the gradient coil. This embodiment is advantageous because each of the first and second gradient coil sections are each torque balanced. This will lead to less mechanical motion of the first and second gradient coil sections. This may lead to a reduction in noise during operation of the magnetic resonance imaging system.

In another embodiment the coil windings of the first gradient coil section are rigidly attached to the first rigid element and the coil windings of the second gradient coil sections are rigidly attached to the second rigid element. This embodiment is advantageous because when current passes through a gradient coil and the gradient coil is in a large magnetic field there are Lorentz forces exerted on the coil winding. By having the coil windings rigidly attached to the rigid material the forces on the coil winding are transferred to the rigid material. In some embodiments the coil windings are fixed to the surface of the rigid elements and in other embodiments the coil winding are fully or partially embedded in the rigid elements.

In another embodiment the first and second rigid elements are elastically mounted to the magnet. This embodiment is advantageous because the use of elastic material to join the first and second gradient coil sections to the magnet reduces the transfer of mechanical vibrations between the gradient coil sections and the magnet. This may lead to reduced acoustic noise during operation of the magnetic resonance imaging magnet.

In another embodiment the connecting element comprises a viscous element that joins the first and second rigid elements. This embodiment is advantageous because the viscous element may dissipate acoustic vibrations between the first and second gradient coil sections. This may have the effect of reducing acoustic noise generated by the magnetic resonance imaging magnet assembly during use. The viscous element may be a material that is elastic and lossy. The viscous element may also be a mechanical element designed to dissipate energy. For instance small shock absorbers may be positioned between the first and second gradient coils to dissipate energy.

In another embodiment the connecting element comprises a lap joint. A lap joint as used herein is an overlapping joint that connects two elements. For instance two elements may dovetail or have a notch which fits together. In one variant the first and second gradient coil sections are cylindrical. A larger cylinder overlaps both the first and second gradient coil sections and this overlapping cylinder forms the lap joint.

In another embodiment the elastic material of the connecting element is compressed. For instance a flange system with bolts or threaded rods may be used to compress an elastic or for instance a rubber element between the first and second gradient coil sections. This embodiment is advantageous because it forms a joint that changes the acoustic resonance of the gradient coil and also may dissipate acoustic energy being transmitted between the first and second gradient coil sections.

In another embodiment the first and second gradient coil sections are electrically isolated. This embodiment is advantageous because this prevents mechanical energy by being transmitted by the connections between the first and second gradient coil sections.

In another embodiment the first and second gradient coil sections are connected electrically using bus bars. The bus bars are mounted elastically to the first and second rigid elements. This embodiment is advantageous because the first and second gradient coils can be connected electrically without acoustically coupling them. This may reduce the acoustic noise generated by the magnetic resonance imaging magnet assembly during operation.

In another embodiment the first and second gradient coil sections have separate cooling water connections and electrical power connections. That is to say that the coils which make up each of the first and second gradient coil sections are powered separately. For instance the z coil in the first gradient coil section may be connected to a gradient coil power supply and the z coil of the second gradient coil section may also be connected separately to the same or a different power supply. By having separate cooling water connections and electrical power connections the acoustic coupling between the first and second gradient coil sections may be reduced. This may have the benefit of reducing the acoustic noise generated by the magnetic resonance imaging magnet assembly during operation.

In another embodiment the first gradient coil section and the second gradient coil section are torque balanced for Lorentz forces in the magnetic field of the magnet. The first gradient coil section and the second gradient coil section are translational force balanced for Lorentz forces in the magnetic field of the magnet. This is advantageous because during use the magnets will not exert force on each other and this may have the effect of reducing noise generated by the magnetic resonance imaging magnet assembly.

In another embodiment the elastic material couples vibrations between the first gradient coil section and the second gradient coil section. This has the effect of reducing the acoustic noise generated by the magnetic resonance imaging magnet assembly during operation. This is because the resonant frequency of the gradient coil is changed by doing this.

In another embodiment the elastic material is a viscoelastic material. This embodiment is advantageous because the elastic material is lossy. That is to say that acoustic energy being transmitted between the two gradient coil sections is dissipated within the elastic material. This may have the effect of reducing the acoustic noise generated by the magnetic resonance imaging magnet assembly during operation.

In another aspect the invention provides for a magnetic resonance imaging system. The magnetic resonance imaging system comprises a magnetic resonance imaging magnet assembly according to an embodiment of the invention. The magnetic resonance imaging system further comprises a radio frequency system for acquiring magnetic resonance data. Magnetic resonance data is defined herein as being the recorded measurements of radio frequency signals emitted by atomic spins by the antenna of a Magnetic resonance apparatus during a magnetic resonance imaging scan. A Magnetic Resonance Imaging (MRI) image is defined herein as being the reconstructed two or three dimensional visualization of anatomic data contained within the magnetic resonance data. This visualization can be performed using a computer.

The radio frequency system is adapted to connect to a radio frequency antenna. The radio frequency system may be the combination of a transmitter and a receiver or it may be a transceiver. Accordingly the radio frequency antenna may be a single antenna which is used to send and receive radio signals or it may be a separate transmit and receive antenna. The magnetic resonance imaging system further comprises a magnetic field gradient coil power supply for supplying current to the magnetic field gradient coil. The magnetic resonance imaging system further comprises a computer system adapted for constructing images from the magnetic resonance data. The computer system is adapted for generating magnetic resonance images of the subject using the magnetic resonance data. The advantages of this embodiment have been previously discussed.

In another aspect the invention provides for a gradient coil for generating a magnetic field for spatial encoding of the magnetic spins of nuclei within an imaging volume of a magnetic resonance imaging system. The gradient coil is adapted to be mounted into a magnet of the magnetic resonance imaging system. The gradient coil comprises a first gradient coil section. The first gradient coil section comprises a first rigid element. The gradient coil comprises a second gradient coil section. The second gradient coil section also comprises a second rigid element. The gradient coil further comprises a connecting element for joining the first and second gradient coil sections. The connecting element comprises an elastic material. The elastic material is in contact with the first and second rigid elements. The advantages of this gradient coil have been previously discussed.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
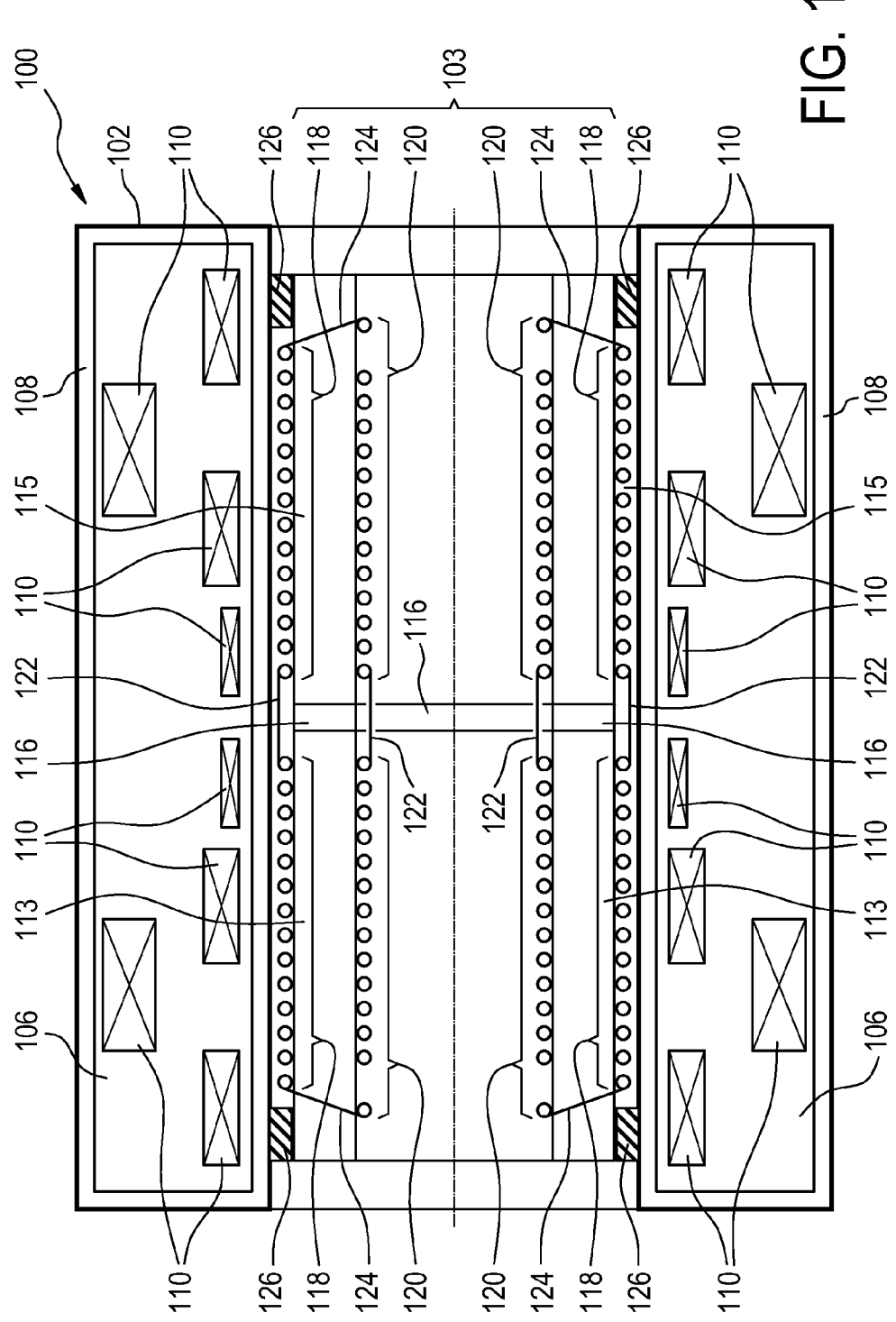
FIG. 1 shows a cross-sectional view of a magnetic resonance imaging magnet assembly according to an embodiment of the invention.

FIG. 1 shows a cross-sectional view of a magnetic resonance imaging magnet assembly 100 according to an embodiment of the invention. The magnet assembly 100 comprises a magnet 102 and a gradient coil 103. The magnet 102 shown in this FIG. is a magnet with a cylindrical symmetry. The axis of symmetry 104 of the magnet 102 is shown. The magnet 102 comprises a cryostat 106. The cryostat 106 is surrounded by an insulation system which may comprise a vacuum 108. The insulation system may also comprise a liquid nitrogen tank or vessel. Inside the cryostat 106 are superconducting coils 110.

The gradient coil 103 comprises a first gradient coil section 112 and a second gradient coil section 114. The first gradient coil section 112 and the second gradient coil section 114 are joined by a connecting element 116. The first gradient coil section comprises a first rigid element 113. The second gradient coil section comprises a second rigid element 115. The connecting element joins the rigid elements 113, 115 of the first and second gradient coil sections 112, 114. Both of the gradient coil sections 112, 114 are shown as having both outer windings 118 and inner windings 120. All of the outer windings 118 and the inner windings 120 are rigidly connected to the rigid elements 113 and 115. Bus bars 122 are used to connect the outer windings 118 of the first and second gradient coil sections 112, 114. Likewise bus bars 122 are also used for connecting the inner windings 120 of the first and second gradient coil sections 112, 114. The gradient coil 103 is shown as being mounted to the magnet 102 using the elastic mounts 126.

The elastic mounts 126 may be elastic or they may also be visco-elastic in which case acoustic energy is dissipated in the elastic mounts. Likewise the connecting element may be an elastic or viscous element. It may be an elastic element, or it may be a visco-elastic element. The connecting element 116 serves during operation to change the resonant properties of the gradient coil 103. This may have the effect of reducing acoustic noise generated within the magnet assembly 100.

Figure 2:
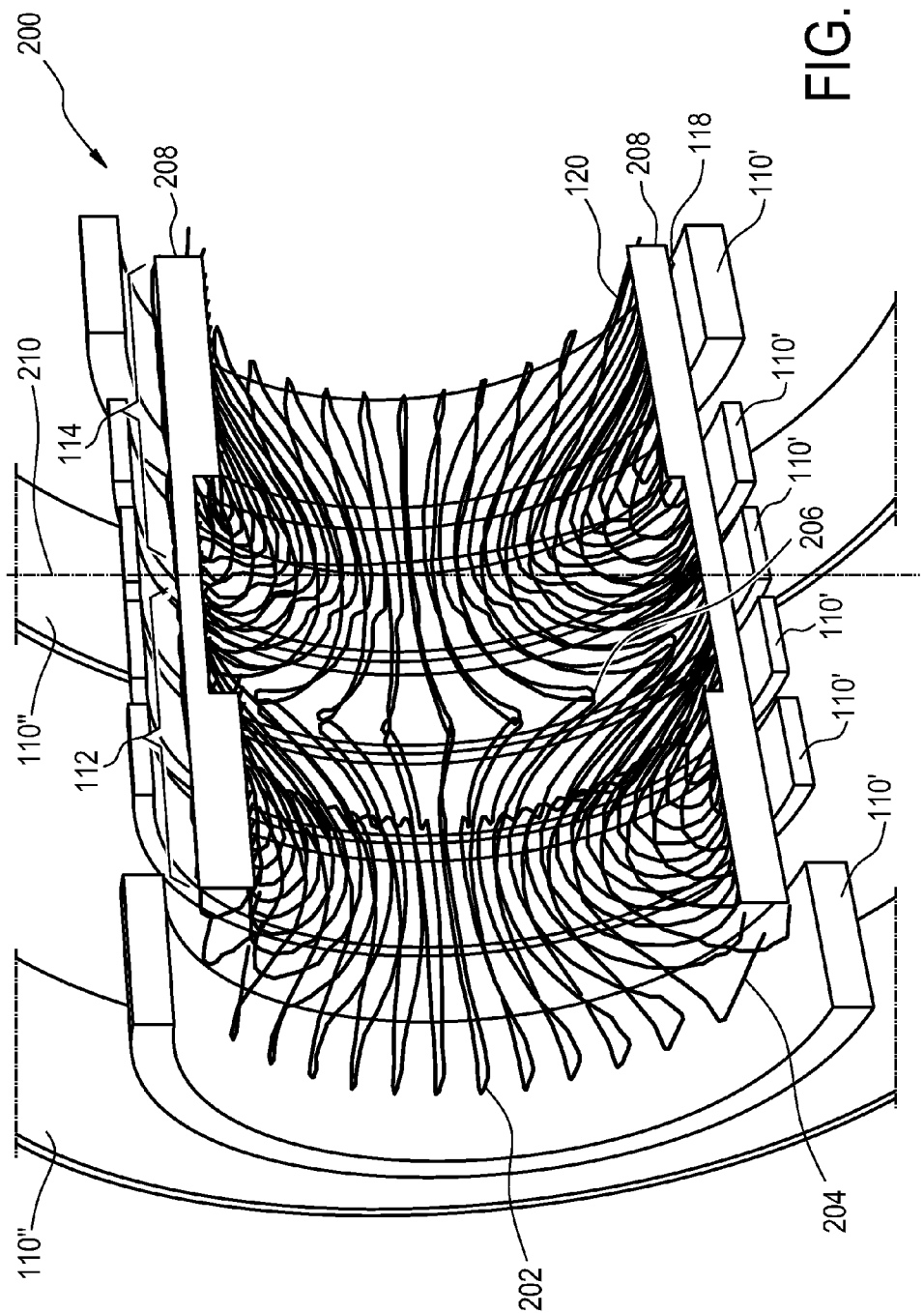
FIG. 2 shows a perspective, cross-sectional view of the windings of an embodiment of a magnet assembly according to the invention.

FIG. 2 shows a cross-sectional view of the windings 200 of an embodiment of a magnet assembly according to the invention. Inner coils of the magnet are labeled 110'. Outer coils of the magnet are labeled 110". The regions labeled 208 show the location of where the rigid element would be. The inner 120 and outer 118 windings are shown inside and outside of the region 208. The inner windings 120 is the primary layer of the gradient coil windings and the outer windings 118 are the shield layer of the gradient coil windings.

The axis labeled 210 is a rotational axis of symmetry for the magnet assembly. This axis is located on a plane which divides the gradient coil into the first gradient coil section 112 and the second gradient coil section 114. The magnet has mirror- and rotational symmetry. The symmetry plane of the magnet coincides with the mid-plane of the gradient coil.

202 is a flange conductor. In this embodiment, the end flange conductor 202 of the gradient coil is located somewhere within the volume enclosed by the inner coil of the magnet 110' further from the mid-plane of the magnet. Without the end flange conductors the gradient coil would need to be made longer to achieve torque balancing. The further from the mid-plane of the magnet, the less homogeneous the magnetic field is. In homogeneities of the magnetic field can be used to design a gradient coil which is torque balanced.

204 is also a flange conductor. The flange conductor 204 is clearly not running radially outwards. The flange conductor 204 starts and stops on a shield coil 118 winding.

206 is a flange conductor near the mid-plane of the gradient coil.

The flange conductor labeled 206 is near the mid-plane of the gradient coil. The mid-plane of the gradient coil is where the gradient coil is split into the first and second gradient coil sections. The gradient coil also features a recessed section of the primary gradient coil windings near the split between the first 112 and second 114 gradient coil sections.

Figure 3A:
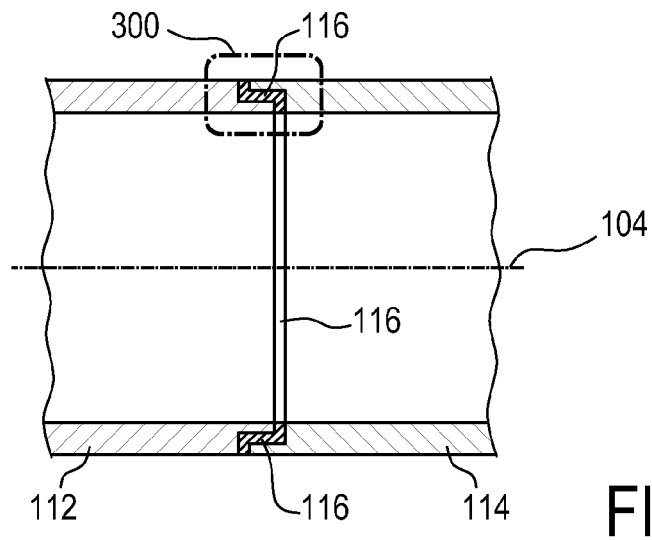
FIG. 3A shows an example of lap joints according to an embodiment of the invention.
Figure 3B:
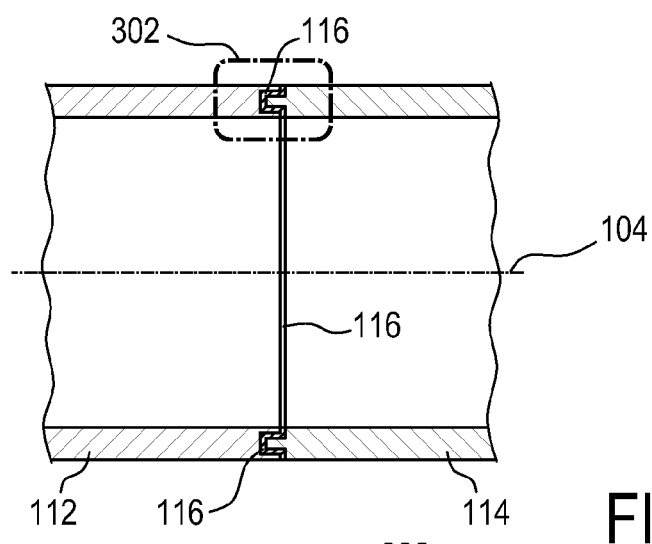
FIG. 3B shows a further example of lap joints according to an embodiment of the invention.
Figure 3C:
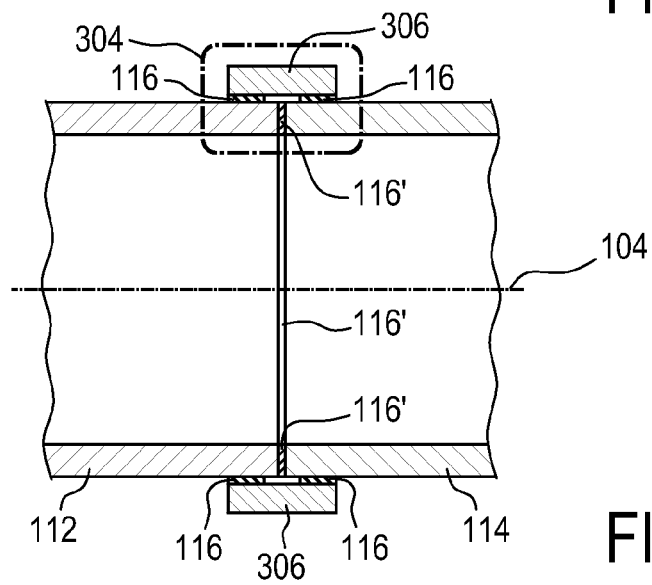
FIG. 3C shows a further example of lap joints according to an embodiment of the invention.

FIGS. 3a, 3b and 3c show examples of lap joints 300, 302, 304 which join the first gradient coil section 112 to the second gradient coil section 114. In FIG. 3a a section of a cylindrical gradient coil is shown. The first gradient coil section 112 is joined to the second gradient coil section 114 by an overlapping lap joint 300. A connecting element 116 is shown as connecting the first gradient coil section 112 with the second gradient coil section 114.

FIG. 3b is very similar to 3a except instead of using the overlapping joint a tongue-in-groove lap joint 302 is used. Then a connecting element 116 connects the first gradient coil section 112 to the second gradient coil section 114.

In FIG. 3c a different style lap joint 304 is shown. In the embodiment shown in FIG. 3c a connecting cylinder 306 is used to join the first gradient coil section 112 with the second gradient coil section 114. A connecting element 116 connects the first gradient coil section 112 to the connecting cylinder 306. The connecting cylinder 306 is then connected via another section of 116 to the second gradient coil section 114. In this embodiment the connecting element 116 is shown as two distinct pieces. However, in some embodiments a single piece of connecting element could be used. Also shown is connecting element 116' which is between the first gradient coil section 112 and the second gradient coil section 114. This connecting element 116' is optional. In addition the embodiment of FIG. 3c could be combined with the embodiments shown in FIG. 3a or 3b.

Figure 4:
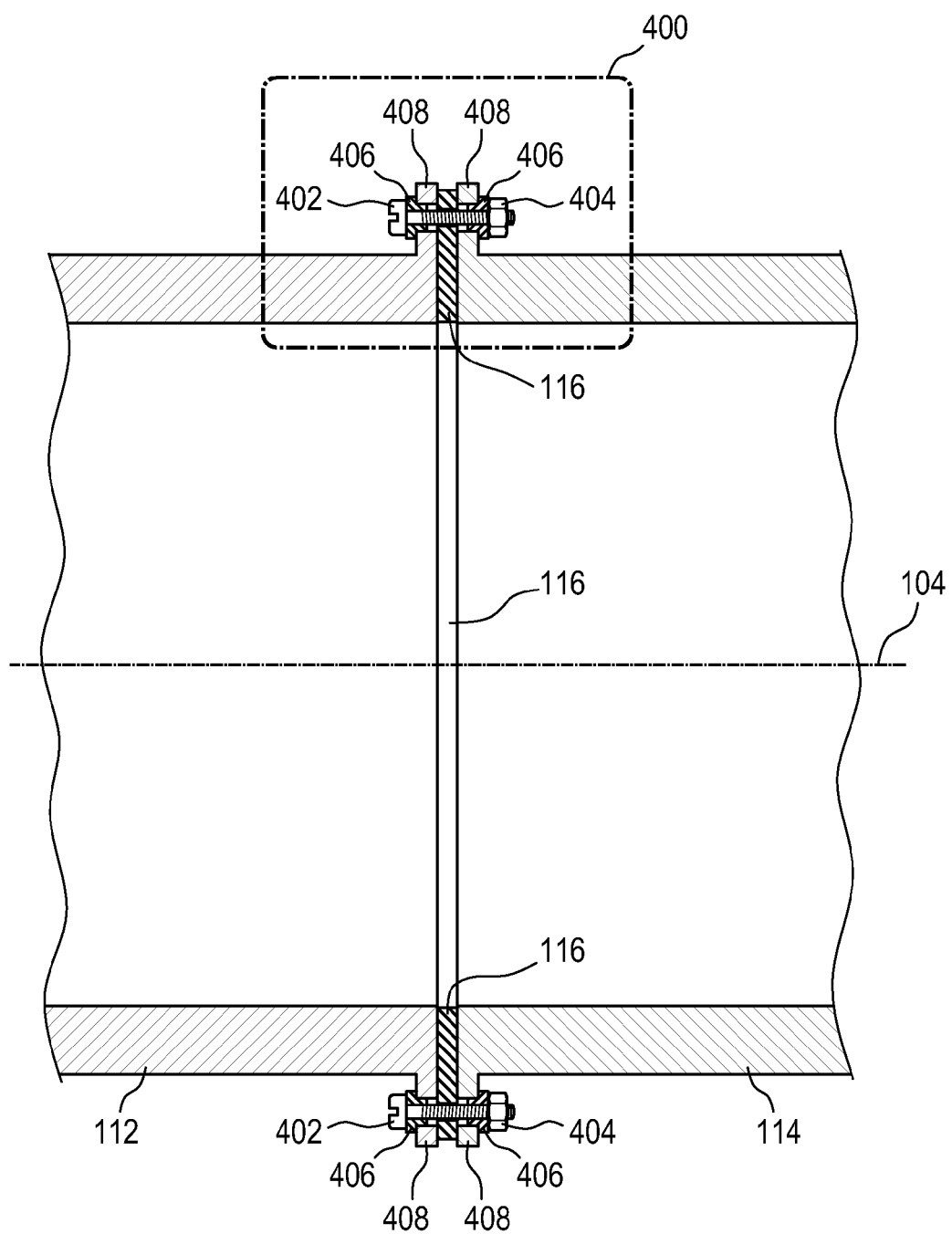
FIG. 4 shows an example of a compression joint which compresses the connecting element according to an embodiment of the invention.

FIG. 4 shows an example of a compression joint 400 which joins the first gradient coil section 112 to the second gradient coil section 114. In this embodiment the connecting element 116 is compressed. Both the first gradient coil section 112 and the second gradient coil section 114 have flanges 408. Going around the circumference of the gradient coil there may be a number of bolts 402 which are tightened using nuts 404. The combination of the bolt 402 and the nut 404 is used to place the connecting element 116 under compression. The bolts 402 and the nuts 404 are vibrationally isolated from the first and second gradient coil sections 112, 114 by vibration isolation elements 406. In this example the vibration isolation elements 406 may simply be large rubber washers which prevent the bolt 402 and the nut 404 from coming in direct contact with either the first gradient coil section 112 or the second gradient coil section 114.

Figure 5:
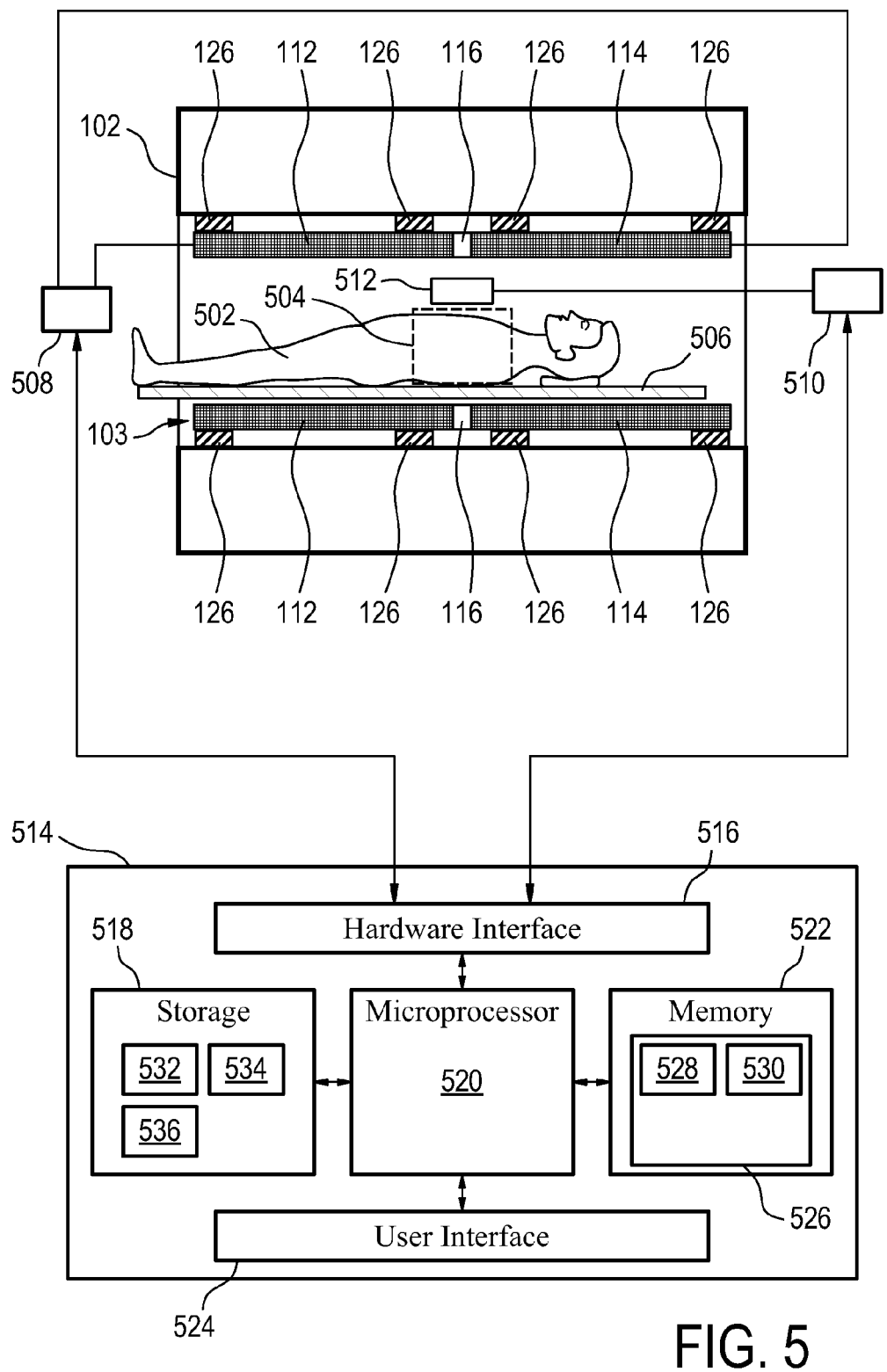
FIG. 5 shows a functional block diagram of a magnetic resonance imaging system according to an embodiment of the invention.

FIG. 5 shows a functional block diagram of a magnetic resonance imaging system 500 according to an embodiment of the invention. The magnetic resonance imaging system comprises a magnetic resonance imaging magnet assembly according to an embodiment of the invention. The magnet assembly comprises a magnet 102 and a gradient coil 103. As was explained before the gradient coil comprises a first gradient coil section 112 and a second gradient coil section 114 that is joined by a connecting element 116. The gradient coil 103 is mounted in the magnet 102 using elastic mounts 126. In other embodiments the ends of the gradient coil 103 may be mounted to the magnet 102 using rigid mounts. However, elastic mounts 126 have the advantage that they provide vibration isolation between the gradient coil 103 and the magnet 102.

The magnet 102 has an imaging zone 504. Within the imaging zone 504 the magnetic resonance imaging system 500 can acquire magnetic resonance data 536. A subject 502 is shown partially within the imaging zone 504 and the subject 502 is supported by a subject support 506. The gradient coil 103 is connected to a gradient coil power supply 508 which supplies current to the gradient coil 103. In this example the first gradient coil section 112 and the second gradient coil section 114 are connected separately to the gradient coil power supply 508. The first and second gradient coil sections may also be supplied independently with a cooling fluid such as water. Alternatively the first and second gradient coil sections may be supplied by a single good cooling system.

The magnetic resonance imaging system 500 also comprises a radio frequency transceiver 510 which is connected to an antenna 512. The combination of the radio frequency transceiver 510 and the antenna 512 allows the manipulation or the orientation of magnetic spins within the imaging zone 504. The radio frequency transceiver 510 and the antenna 512 also allow the reception of magnetic resonance signals from within the imaging zone 504 also.

The gradient coil power supply 508 and the radio frequency transceiver 510 are connected to the hardware interface 516 of a computer system 514. Through the hardware interface 516 the computer system 514 is able to record the magnetic resonance symbols as magnetic resonance data 536. The computer system further comprises a microprocessor 520 which is connected to the hardware interface 516, computer storage 518, computer memory 522 and a user interface 524. The storage may be for example a hard drive. The memory 522 may be random access memory. The user interface 524 is an interface which a user uses to interact with the computer system 514. This interface may comprise such things as a display unit such as a computer display. It may also contain input devices such as a mouse, keyboard, or touch pad.

The computer storage 518 contains a program for the execution of software for controlling the magnetic resonance imaging system 500. The storage 518 further contains a magnetic resonance image 534. This image 534 may be rendered on a display of the user interface 524. Also within the storage 518 is magnetic resonance data 536 which was acquired by the magnetic resonance imaging system 500. The memory 522 contains a copy of the program 532. The program 532 in memory is labeled as 526. The program 526 contains a module 528 for controlling the operation of the magnetic resonance imaging system. The program 526 also contains a module 530 for performing image reconstruction. This is the reconstruction of magnetic resonance data 536 into a magnetic resonance image 534. While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS 100 magnetic resonance imaging magnet assembly
102 magnet
103 gradient coil
104 axis of symmetry
106 cryostat
108 vacuum
110 superconducting coils
110' inner coils of magnet
110" outer coils of magnet
112 first gradient coil section
113 first rigid element
114 second gradient coil section
115 second rigid element
116 connecting element
116' connecting element
118 outer windings
120 inner windings
122 bus bar
124 flange conductor
126 elastic mount
200 windings of magnet assembly
202 flange conductor
204 flange conductor
206 flange conductor
208 location of rigid element
210 axis of rotational symmetry
300 overlapping lap joint
302 tongue in groove lap joint
304 lap joint
306 connecting cylinder
400 compression joint
402 bolt
404 nut
406 vibration isolation elements
500 magnetic resonance imaging system
502 subject
504 imaging zone
506 subject support
508 gradient coil power supply
510 radio frequency transceiver
512 antenna
514 computer system
516 hardware interface
518 storage
520 processor
522 memory
524 user interface
526 program
528 control module
530 image reconstruction module 532 program
534 magnetic resonance image
536 magnetic resonance data

The invention claimed is:

1. A magnetic resonance imaging magnet assembly comprising:
   a magnet configured to generate a main magnetic field for aligning the magnetic spins of nuclei of a subject located within an imaging volume; and
   a gradient coil configured to generate a gradient magnetic field for spatial encoding of the magnetic resonance signal of spins of nuclei within the imaging volume, wherein the gradient coil is adapted to be mounted into the magnet, wherein the gradient coil comprises:
   a first gradient coil section comprising a first rigid element,
   a second gradient coil section comprising second rigid element,
   a connecting element configured to join the first and second gradient coil sections, the connecting element comprising an elastic material, wherein the elastic material is disposed where the first and second gradient coil sections join, and is in contact with the first rigid element and the second rigid element.

2. The magnetic resonance imaging magnet assembly of claim 1, wherein each of the first and second gradient coil sections comprise coil windings, wherein the first and second gradient coil sections comprise inner and outer windings, wherein the coil windings comprise flange conductors, wherein the flange conductors are portions of the coil windings that are adapted to conduct current between the inner and out windings, and wherein the flange conductors are adapted to balance the torque exerted on the gradient coil by the main magnetic field during operation of the gradient coil.

3. The magnetic resonance imaging magnet assembly of claim 2, wherein the coil windings of the first gradient coil section are rigidly attached to the first rigid element, and wherein the coil winding of the second gradient coil section are rigidly attached to the second rigid element.

4. The magnetic resonance imaging magnet assembly of claim 1, wherein both the first and second rigid elements are elastically mounted to the magnet.

5. The magnetic resonance imaging magnet assembly of claim 1, the connecting element comprises a viscous element that joins the first and second rigid elements.

6. The magnetic resonance imaging magnet assembly of claim 1, wherein the connecting element comprises a lap joint.

7. The magnetic resonance imaging magnet assembly of claim 1, wherein the elastic material of the connecting element is compressed.

8. The magnetic resonance imaging magnet assembly of claim 1, wherein the first and second gradient coil sections are electrically isolated.

9. The magnetic resonance imaging magnet assembly of claim 8, wherein the first and second gradient coil sections are connected electrically using bus bars, and wherein the bus bars are mounted elastically to the first and second rigid elements.

10. The magnetic resonance imaging magnet assembly of claim 8, wherein the first and second gradient coil sections have separate cooling water connections and electrical power connections.

11. The magnetic resonance imaging magnet assembly of claim 1, wherein the first gradient coil section and the second gradient coil section are torque balanced for Lorentz forces in the magnetic field of the magnet, and wherein the first gradient coil section and the second gradient coil section are translational force balanced for Lorentz forces in the magnetic field of the magnet.

12. The magnetic resonance imaging magnet assembly of claim 1, wherein the elastic material couples vibrations between the first gradient coil section and the second gradient coil section.

13. The magnetic resonance imaging magnet assembly of claim 1, wherein the elastic material is a visco-elastic material.

14. A magnetic resonance imaging system comprising:
   a magnetic resonance imaging magnet assembly according to any one of the preceding claims;
   a radio frequency system configured to acquire magnetic resonance data, wherein the radio frequency system is configured to connect to a radio frequency antenna;
   a magnetic field gradient coil power supply configured to supply current to the magnetic field gradient coil; and
   a computer system configured to construct images from magnetic resonance data and to control the operation of the magnetic resonance imaging system, wherein the computer system is configured to generate magnetic resonance images of a subject using the magnetic resonance data.

15. A gradient coil configured to generate a magnetic field for spatial encoding of the magnetic spins of nuclei within an imaging volume, wherein gradient coil is adapted to be mounted into a magnet of a magnetic resonance imaging system, the gradient coil comprising:
   a first gradient coil section comprising a first rigid element;
   a second gradient coil section comprising a second rigid element; and
   a connecting element configured to join the first and second gradient coil sections, the connecting element comprising an elastic material, wherein the elastic material is in contact with the first rigid element and the second rigid element.

16. The gradient coil of claim 15, wherein the first and second gradient coil sections are connected electrically using bus bars, and wherein the bus bars are mounted elastically to the first and second rigid elements.

17. The gradient coil of claim 15, wherein the first and second gradient coil sections have separate cooling water connections and electrical power connections.

18. The gradient coil of claim 15, wherein the first gradient coil section and the second gradient coil section are torque balanced for Lorentz forces in the magnetic field of the magnet, and wherein the first gradient coil section and the second gradient coil section are translational force balanced for Lorentz forces in the magnetic field of the magnet.

19. The gradient coil of claim 15, wherein the elastic material couples vibrations between the first gradient coil section and the second gradient coil section.

20. The gradient coil of claim 15, wherein each of the first and second gradient coil sections comprises coil windings, wherein the first and second gradient coil sections comprise inner and outer windings, wherein the coil windings comprise flange conductors, wherein the flange conductors are portions of the coil windings that are adapted to conduct current between the inner and out windings, and wherein the flange conductors are adapted to balance the torque exerted on the gradient coil by the main magnetic field during operation of the gradient coil.

* * * * *